(12) United States Patent
Sankar et al.

(10) Patent No.: US 7,953,783 B2
(45) Date of Patent: May 31, 2011

(54) INTERPOLATING CUBIC SPLINE FILTER AND METHOD

(75) Inventors: Pathamadai V. Sankar, Tustin, CA (US); John J. Hanrahan, Laguna Hills, CA (US); Mahesh C. Reddy, Irvine, CA (US); Arun Ayyagari, Seattle, WA (US)

(73) Assignee: The Boeing Company, Chicago, IL (US)

( * ) Notice: Subject to any disclaimer, the term of this patent is extended or adjusted under 35 U.S.C. 154(b) by 968 days.

(21) Appl. No.: 11/833,039

(22) Filed: Aug. 2, 2007

(65) Prior Publication Data

US 2009/0037505 A1 Feb. 5, 2009

(51) Int. Cl.
*G06F 17/17* (2006.01)
(52) U.S. Cl. .................................................. 708/313
(58) Field of Classification Search .................. 708/313
See application file for complete search history.

(56) References Cited

U.S. PATENT DOCUMENTS 7,439,885 B2 * 10/2008 Jensen ......................... 708/313
2006/0176989 A1 * 8/2006 Jensen ......................... 375/350

OTHER PUBLICATIONS

Colley, James W. and Tuckey, John W. "An Algorithm for the Machine Calculation of Complex Fourier Series," Mathematics of Computation, vol. 19, No. 90, Apr. 1965, pp. 297-301.
McClellan, James H. and Parks, Thomas W. "A Unified Approach to the Design of Optimum FIR Linear-Phase Digital Filters," IEEE Transactions on Circuit Theory, vol. CT-20, Nov. 1973, pp. 697-701.
Neuvo, Yrjo, Cheng-Yu, Dong and Mitra, Sanjit K. "Interpolated Finite Impulse Response Filters," IEEE Transactions on Acoustics, Speech and Signal Processing, vol. ASSP-32, Jun. 1984, pp. 563-570.
Bryan, Nicholas J. "Interpolated Finite Impulse Response Filters: Improvements on Design Case Study," Digital Signal Processing, Oct. 2006, pp. 1-8.
Bada, A. M. and Maddiotto, M. "Design and Realisation of Digital Radio Transceiver Using Software Radio Architecture," IEEE VTC 2000, pp. 1727-1731.
Daneshgaran, Fred and Laddomada, Massimiliano. "Transceiver Front-End Technology for Software Radio Implementation of Wideband Satellite Communication Systems," Kluwer Academic Press, 2002, pp. 1-29.
Pang, D., Ferrari, L.A. and Sankar, P.V. "A Unified Approach to General IFIR Filter Design Using B-Spline Functions," Maple Press 1989, pp. 228-232.

(Continued)

*Primary Examiner* — Tan V Mai
(74) *Attorney, Agent, or Firm* — Harness, Dickey & Pierce, P.L.C.

(57) ABSTRACT

A filter for high speed digital signal processing. In one embodiment the filter includes a linear, phase-B, interpolating cubic spline filter having a pre-filter section and an interpolating post-filter section. The pre-filter section may be formed to implement any one of a 1-4-1 cubic spline function, a 2-5-2 cubic spline function or a 1-2-1 cubic spline function. The post-filter may be formed using a plurality of running average filters arranged in a cascade (i.e., serial) fashion. The filter can be constructed using significantly fewer independent component parts for a given level of pass band and stop band performance criteria, as compared with a conventional finite impulse response (FIR) filter. The filter is thus ideally suited for implementation with very large scale integration (VLSI) technology, and in a wide variety of electronic devices where high speed digital filtering is required.

18 Claims, 8 Drawing Sheets

OTHER PUBLICATIONS

Juszkiewicz, Richard S. "An Analysis of Interpolated Finite Impulse Response Filters and Their Improvements," EEN 536—Case Study I, Nov. 2005, pp. 1-6.

Xilinx, Distributed Arithmetic FIR Filter v9.0, DS240 Apr. 28, 2005, pp. 1-45.

Agatep, Antolin. Xilinx, Xilinx Spartan-II FIR Filter Solution, WP116 (v1.0) Apr. 5, 2000, pp. 1-20.

Hwang, Sun-Young, Choi, Jong-Kwan and Kim, Sik. "Design of an Area-Efficient Interpolated FIR Filter Based on LUT Partitioning," 11 pages.

Ferrari, Leonard A. and Sankar, P. V. "Minimum Complexity FIR Filters and Sparse Systolic Arrays," IEEE Transactions on Computers, vol. 37, No. 6, Jun. 1988, pp. 760-764.

Rayavarapu, Neela R. and Prakash, Neelam Rup. "A Computationally Efficient Design for Protoype Filters of an M-Channel Cosine Modulated Filter Bank," Transactions on Engineering, Computing and Technology, vol. 13, May 2006, ISSN 1305-5313, pp. 272-274.

Vainio, Olli. "An Approach to Least-Squares Design of Interpolated FIR Filters," EEN536 Digital Signal Processing, Oct. 18, 2006, 4 pages.

Tamura, Fumihiko et. al. "Digital RF Feedforward Systems for Beam Loading Compensation in JKJ Synchrotrons,"EPAC 2002, Paris, France, pp. 2106-2109.

Computer Aided Design of FIR Filters, 22 pages.

Vaidyanathan, P.P. "Efficient and Multiplierless Design of FIR Filters with Very Sharp Cutoff via Maximally Flat Building Blocks," IEEE Transactions on Circuits and Systems, vol. CAS-32, No. 3, Mar. 1985, pp. 236-244.

McClellan, James H. and Parks, Thomas W. "A Personal History of the Parks-McClellan Algorithm," IEEE Signal processing Magazine, Mar. 2005, pp. 82-86.

http://en.wikipedia.org/wiki/De_Boor's_algorithm, printed Jan. 14, 2008, 2 pages.

De Boor, Carl. Applied Mathematical Sciences, "A Practical Guide to Splines," Springer-Verlag, New York, pp. 129-135.

* cited by examiner

X(N) → [Y = X* H FIR FILTER] →

$$Y(N) = H(0)X(N) + H(1)X(N-1) + H(2)X(N-2) \ldots H(P)X(N-P)$$

M IS THE COARSE TO FINE SAMPLING RATIO OF THE IFIR FILTER

FIG 6

M IS THE COARSE TO FINE SAMPLING RATIO OF THE IFIR FILTER

M IS THE COARSE TO FINE SAMPLING RATIO OF THE IFIR FILTER

FIG 7

| Type of Spline | Generalized Cubic Spline Basis Function (Lowpass Filter) | Derivative Impulses (fourth derivative) |
|---|---|---|
| (1-4-1) cubic B-Spline | $q_0(u) = u^3$<br>$q_1(u) = 1 + 3u + 3u^2 - 3u^3$<br>$q_2(u) = 4 - 6u^2 + 3u^3$<br>$q_3(u) = 1 - 3u + 3u^2 - u^3$ | [ (1/6) −(4/6) 1 −(4/6) (1/6) ] |
| (2-5-2) cubic Spline | $q_0(u) = (9/8) u^2 - (1/8) u^3$<br>$q_1(u) = 1 + (15/8)u + (3/4) u^2 - (9/8)u^3$<br>$q_2(u) = (10/4) - (21/8)u^2 + (9/8)u^3$<br>$q_3(u) = 1 - (15/8)u + (3/4)u^2 + (1/8) u^3$ | [ −(1/8) −1 (18/8) −1 −(1/8) ] |
| (1-2-1) cubic Spline | $q_0(u) = (3/2) u^2 - (1/2) u^3$<br>$q_1(u) = 1 + (3/2)u - (1/2)u^3$<br>$q_2(u) = 2 - (3/2)u^2 + (1/2)u^3$<br>$q_3(u) = 1 - (3/2)u + (1/2) u^3$ | [ −(1/2) 0 1 0 −(1/2) ] |

M IS THE COARSE TO FINE SAMPLING RATIO OF THE IFIR FILTER

| Details | Optimal FIR Filter | Linear Phase 1-4-1 Cubic Spline IFIR Filter |
|---|---|---|
| Pass band | 0-30 M Hz | 0-30 M Hz |
| Transition band | 30-100 M Hz | 30-100 M Hz |
| Stop band | 100 M Hz – 2 G Hz | 100 M Hz – 2 G Hz |
| Pass band error | -49.64 dB | -45.98 dB |
| Stop band error | -57.71 dB | -52.52 dB |
| Number of filter taps | 197 | 197 |
| Number of multipliers | 98 | 21 |
| Number of delay elements | 196 | 216 |
| Number of Adders | 196 | 29 |

INTERPOLATING CUBIC SPLINE FILTER AND METHOD

CROSS-REFERENCE TO RELATED APPLICATIONS

This application is related in general subject matter to concurrently filed U.S. patent application Ser. No. 11/833,068 (Boeing Ref: 07-0206; HDP Ref: 7784-001066), which is incorporated by reference in the present application.

FIELD

The present disclosure relates to filters used in waveform processing applications, and more particularly to an interpolating cubic spline filter that is well adapted for use in band pass and low pass filter applications.

BACKGROUND

At present, band pass and low pass filters are used in a variety of electronic applications to provide needed filtering and/or processing of digital signals. One exemplary application is with Software Defined Radio (SDR) technology. Other applications involve DVD players, High Definition Television (HDTV) receivers, video games and digital music storage and playback devices, just to name a few.

In many applications, the cost of the electronic filtering subsystem(s) of the device is an important consideration in the design of the device. Furthermore, the physical size of the circuit components required to implement many existing digital filter systems does not lend itself well to the implementation of the digital filter using very large scale integration (VLSI) technology. The ability to provide various electronic circuits using VLSI technology is particularly desirable because VLSI technology enables various electronic circuits to be implemented in a highly space efficient manner. This in turn facilitates highly compact packaging of digital circuits, which is important in many applications, and particularly in applications involving hand held transceivers and other hand held digital devices.

Figures 3, 4:
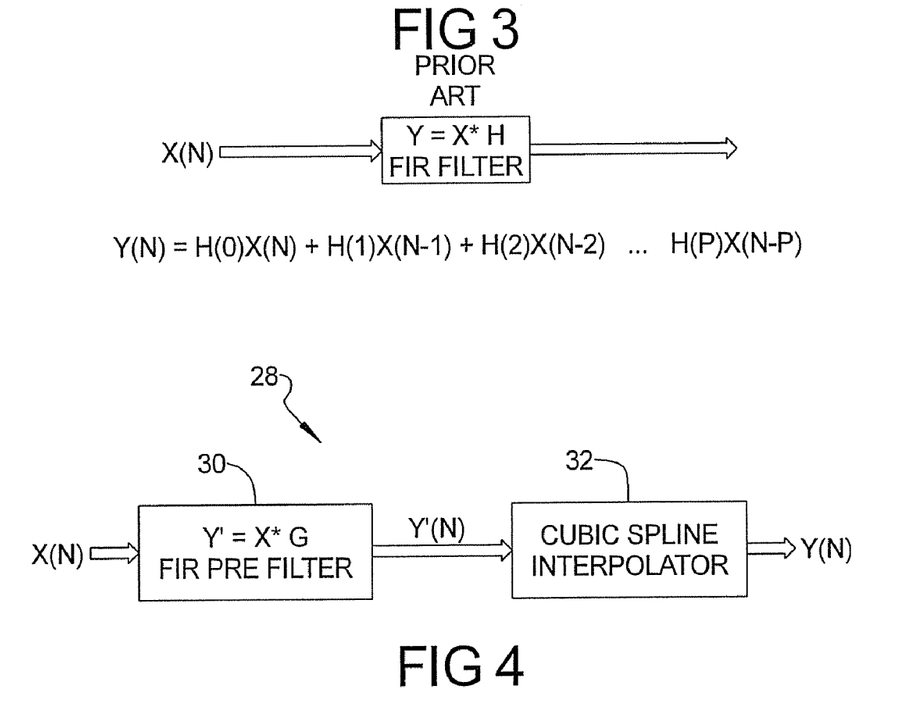
FIG. 3 is a block diagram of a conventional finite impulse response (FIR) filter that may be used with the system and method of the present disclosure to perform high speed digital waveform processing.
FIG. 4 is a block diagram of an interpolated FIR filter that may be used independently of the direct digital radio, or as an independent filtering component with a wide variety of different electronic devices.

One particular form of digital filter presently in use is the finite impulse response (FIR) filter. The conventional FIR filter is shown in FIG. 3. This filter, while effective as a band pass or low pass filter, nevertheless requires a fair number of independent hardware component parts. More specifically, the conventional FIR filter may require hundreds of multipliers and adders depending on the performance requirements of the filter (i.e., pass band, stop band, and desired pass band and stop band error performance, just to name a few).

Accordingly, at the present time there is a high level of interest in producing high speed pass band and low pass filters that are of simpler and more cost effective construction than presently available FIR filters, while still providing performance comparable to an optimally designed FIR filter. There is also a strong interest in providing pass band and low pass filters that can be implemented using VLSI technology in application specific integrated circuits (ASICs) or in Field Programmable Gate Arrays (FPGAs) to form highly space efficient digital signal filtering circuits that are well adapted for use in a wide variety of military and consumer electronic devices.

SUMMARY

An interpolating, cubic spline finite impulse response (IFIR) filter. The filter includes a pre-filter section and an interpolating post filter section.

In one form the pre-filter section makes use of a linear phase-B cubic spline function. In one exemplary embodiment a 1-4-1 cubic spline function is used with the pre-filter. The 1-4-1 cubic spline function is implemented by a circuit including a pair of adders, a pair of multipliers and a pair of delay elements. In another exemplary embodiment a 2-5-2 cubic spline function is used with the pre-filter. In this embodiment the 2-5-2 cubic spline function is implemented by a circuit including a pair of adders, a pair of delay elements, a left shift element and a right shift element. In still another exemplary embodiment of the pre-filter a 1-2-1 cubic spline function is used. The 1-2-1 cubic spline function is implemented by a circuit including a pair of adders and a pair of delay elements.

In one embodiment the interpolating post filter section may include a plurality of running average filters coupled in a cascade arrangement (i.e., serially) that interpolate the output of the pre-filter section. In one specific embodiment four running average filters are coupled in a cascade arrangement.

The various embodiments of the filter require significantly fewer component parts to perform digital waveform processing, as compared with a conventional finite impulse response (FIR) filter, for a given level of pass band and stop band filter performance. The filter of the present disclosure thus forms a significantly less expensive filter, for a given level of filter performance, and thus is well suited for use in a wide variety of filtering applications and a wide variety of devices that require high speed digital signal processing. Since the filter of the present disclosure is implemented with significantly fewer hardware components than a conventional FIR filter, the filter of the present disclosure is well suited for implementation using very large scale integration (VLSI) technology to allow implementation using FPGAs and application specific integrated circuits (ASICs). The requirement for significantly fewer independent component parts for the filter of the present disclosure further enables the filter to be made more compact, and thus more easily implemented in small electronic devices and components. The filter of the present disclosure is also able to be constructed more cost effectively than pre-existing filters having comparable filtering performance capabilities.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
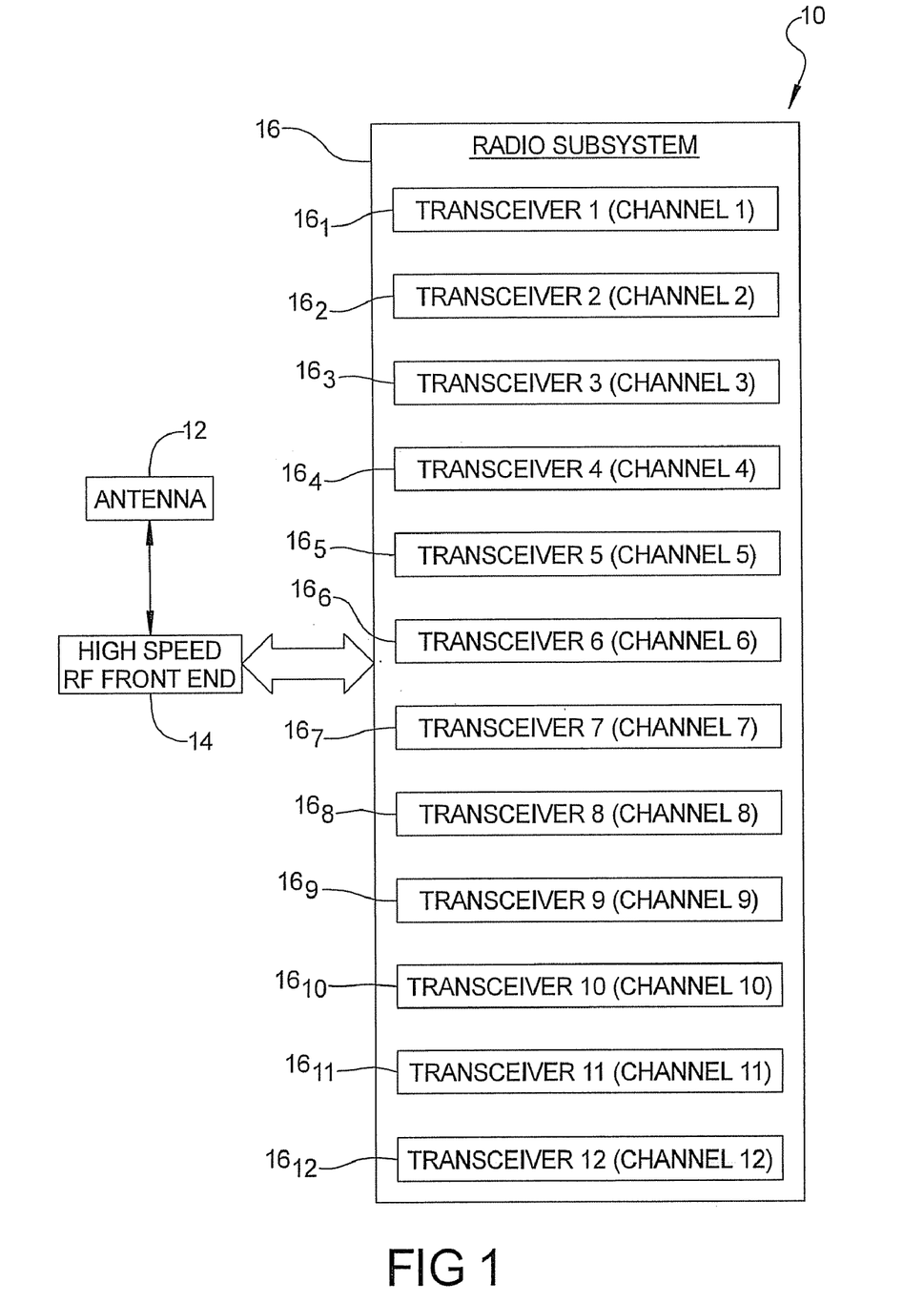
FIG. 1 is a block diagram of a direct digital radio in accordance with one embodiment of the present disclosure.

Referring to FIG. 1, there is shown one exemplary embodiment of a direct digital radio (i.e., transceiver) 10 in accordance with the present disclosure. The direct digital radio (hereinafter the "digital radio") 10 in this example includes an antenna 12 in communication with a high speed RF front end 14. The RF front end 14 is in communication with a multi-channel radio subsystem 16. The radio subsystem 16 in this example has 12 independent but identical RF transceiver subsystems $16_1$-$16_{12}$ that form 12 independent channels tuned to different frequency bands. It will be appreciated immediately, however, that the present disclosure is not limited to only a multi-channel, direct digital radio, but a single channel direct digital radio could just as readily be formed using the teachings presented herein. Also, the frequency ranges shown in FIG. 1 are merely exemplary, and other frequency ranges could be implemented to suit specific applications. It is anticipated that in many applications, the ability to use the digital radio 10 to communicate over a plurality of independent RF channels will be a highly desirable feature. As will be explained further in the following paragraphs, due to the reduction in the total number of component parts required for the waveform processing section of the digital radio 10, the cost savings that may be realized through the construction of the digital radio 10 increases as the number of channels implemented increases.

Referring further to FIG. 1, the high speed RF front end 14 makes use of a Sigma/Delta analog-to-digital converter ("ADC") and digital-to-analog converter ("DAC"). A suitable Sigma/Delta ADC and DAC front end subsystem is commercially available from a number of sources, for example companies such as Terecelo Inc., of Sherman Oaks, Calif. (formerly Techno Concepts Inc.); Hughes Research Laboratories of Malibu, Calif.; GE Fanuc Embedded Systems of Charlottesville, Va. The RF front end 14 preferably provides sampling at rates between about 6-10 GHz, with spurious free dynamic range in excess of 100 dB in the 2-4 MHz frequency range. Thus, when receiving analog RF signals, the high speed ADC operation of the RF front end 14 is able to digitize the RF signals and provide a corresponding digital signal to the radio subsystem 16. Conversely, the RF front end 14 is able to receive a high frequency digital signal and convert it to a corresponding analog signal for transmission by the antenna 12 using its high speed ADC. The use of the high speed RF front end eliminates the need to down-convert RF signals received by the antenna 12 to an intermediate frequency before further waveform processing can be performed by the radio subsystem 16. Thus, the output of the RF front end 14 can be processed substantially entirely in the digital domain.

Figure 2:
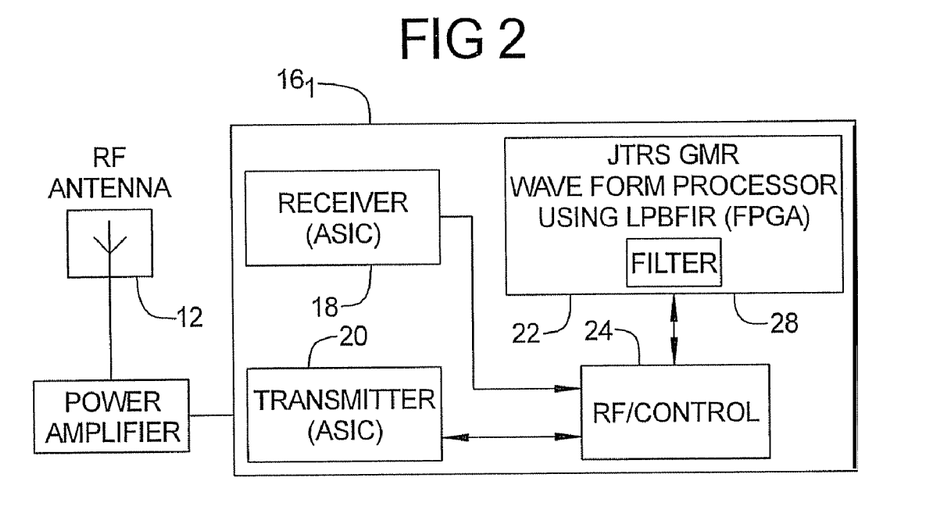
FIG. 2 is a block diagram of one exemplary transceiver configuration in accordance with the present disclosure.

Referring to FIG. 2, one exemplary RF transceiver subsystem $16_1$ is illustrated in greater detail. The RF transceiver subsystem $16_1$ includes a receiver 18, a transmitter 20, a waveform processor subsystem 22 and an RF control subsystem 24. A power amplifier 26 may be used to amplify signals communicated between the transceiver $16_1$ and the antenna 12.

Both the receiver 18 and the transmitter 20 may be provided in application specific integrated circuits (ASICs). The waveform processor subsystem 22 includes a filter 28 which in one form may comprise a finite impulse response (FIR) filter. In another embodiment the filter 28 may comprise an interpolating, linear phase-B cubic spline filter, preferably of the 1-4-1, 2-5-2 or 1-2-1 configurations. Essentially, the filter 28 is used to digitally filter the sampled waveform, in this example a waveform having a frequency between about 30-65 MHz (corresponding to channel "1" in the radio subsystem 16 of FIG. 1). The filter 28 may be used as a pass band filter or a low pass filter, depending on the specific construction of the waveform processor subsystem 22, as will be discussed further below. The RF control subsystem 24 is used to interface the receiver 18 and the transmitter 20 to the waveform processor subsystem 24. The RF control 24 provides circuitry for the appropriate channeling of the digitized input RF waveform to the appropriate band pass filter for the selection of the desired frequency range.

Filter Construction

As mentioned above, a significant feature of the digital radio 10 is the filter 28. However, the filter 28 may be used in a wide variety of signal processing applications, and with a wide variety of other filtering tasks. Thus, it will be appreciated that the filter 28 is not limited to use only in digital radios, but may be used in other types of digital electronic devices where high speed filtering in the digital domain is required. For the following discussion, it will be assumed that the embodiment of the filter 28 being discussed is that of the cubic B-spline, interpolating finite impulse response (IFIR) type (which also may be equivalently expressed as an "interpolating, linear phase-B cubic spline filter).

Referring briefly to FIG. 3, a conventional FIR filter is shown. It may be assumed that the input signal "x" has "n" samples, that the fitter "h" has "p" coefficients and the resultant signal has "N+p−1" samples. This implementation, which is a convolution of "x" with "h" (with "h" being the impulse response of the filter), requires p minus 1 delay elements, p adders and p multipliers. Essentially, this configuration of FIR filter is configured with the principal goal of minimizing pass band and stop band errors. However, it does not provide an optimal design from the design objective standpoint of minimizing the number of individual hardware elements, and thus it is not especially well suited for VLSI (very large scale integration). An optimal design of filter for VLSI implementation is one that minimizes the number of independent hardware component elements, while still providing acceptable pass band and stop band performance. The fewer independent hardware components needed for the filter, the less costly and the smaller the VLSI circuit can be manufactured.

A first embodiment of the cubic B-spline IFIR filter 28, which is substantially equivalent in function to the FIR filter of FIG. 3, is shown in FIG. 4. In this configuration the cubic B-spline IFIR filter 28 is acting as a low pass filter. A FIR pre-filter 30 is used to generate an output y'(n) from an input x(n), and the output y'(n) is fed into a cubic spline interpolator 32. The coarse sampled FIR pre-filter "g" is defined as g(n)=h(n), where n=kM, where k=1 . . . p/M, and is zero elsewhere, and "M" is the ratio of the number of non-zero samples in h to g. Hence, the implementation of the FIR pre-filter 30 using g requires (p−1) delay elements, (p/M) adders and (p/M) multipliers. The FIR pre-filter 30 can be implemented using only 8 delay elements, 4 adders and 4 shift registers. Accordingly, the cubic B-spline FIR filter 28 can be implemented with significantly fewer hardware component elements than a conventional FIR filter having similar performance characteristics.

Figure 5:
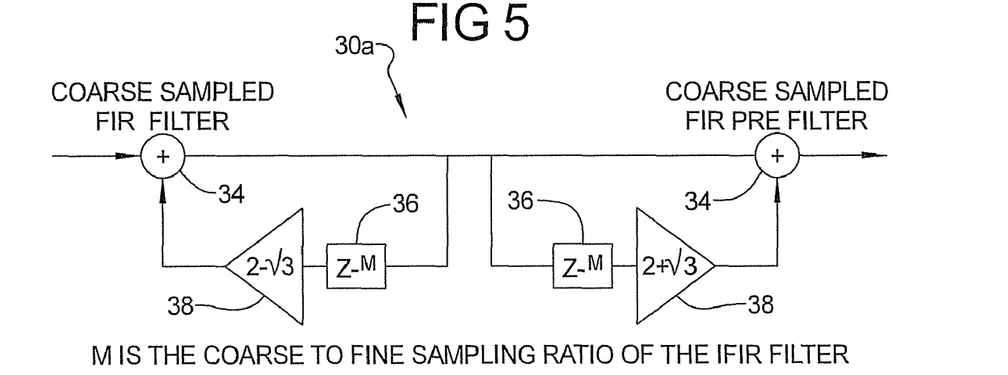
FIG. 5 is a block diagram of one embodiment of the pre-filter section of the filter of FIG. 4 that forms a 1-4-1 cubic spline pre-filter section.

Referring to FIG. 5, one specific implementation of pre-filter (inverse) for implementing the 1-4-1 spline is shown and designated by reference numeral 30a. Two adders 34, two delay elements 36 and two multipliers 38 are used. In this example, "M" is the coarse-to-fine sampling ratio of the cubic B-spline IFIR filter 28, and the gain factors for the multipliers 38 are (2−√3) and (2+√3). The symbol "$z^{-M}$" stands for "M" delay elements. The pre-filter is called the "inverse filter" since it computes the appropriate filter coefficients (i.e., a new set of filter coefficients at locations kM, k=1, . . . , p/M) such that in the coarse sampled domain the effect of applying the pre-filter followed by the post-filter, does not affect the values of g. However, when the pre-filter is applied to g and then the post-filter is applied to y' at the fine sampling rate, it truly interpolates the signal, however retaining the original coefficients of g at the samples kM for k=1, . . . , p/M. This is in essence the meaning of "interpolation".

Figure 6:
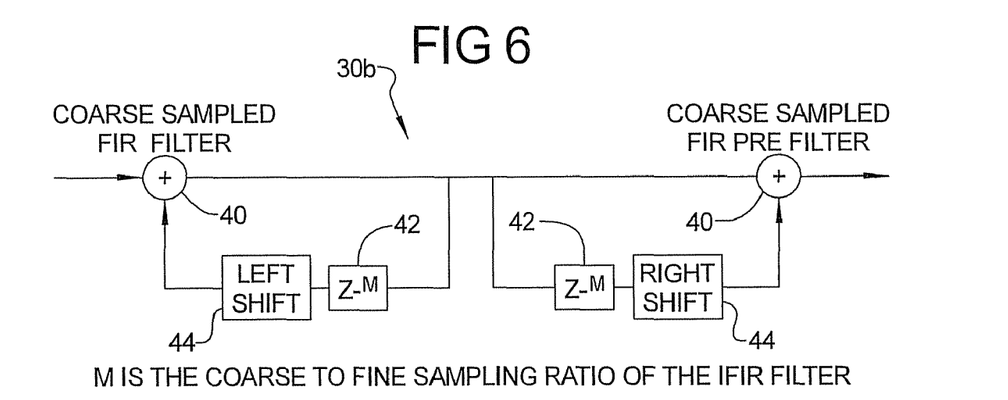
FIG. 6 is a block diagram of a different embodiment of the pre-filter of FIG. 4 in which a 2-5-2 cubic spline pre-filter is formed.

FIG. 6 illustrates an implementation of a pre-filter (inverse) 30b for implementing the 2-5-2 spline. This implementation of the pre-filter makes use of just two adders 40, two delay elements 42, and the gain factors are just left and right shifts 44a and 44b. As mentioned earlier in section this pre-filter computes a new set of coefficients corresponding to the coarse sampled values at locations kM, k=1, . . . p/M in order to facilitate interpolation in a later performed operation. Again, in this example, "M" is the coarse-to-fine sampling ratio of the cubic B-spline IFIR filter 28.

Figure 7:
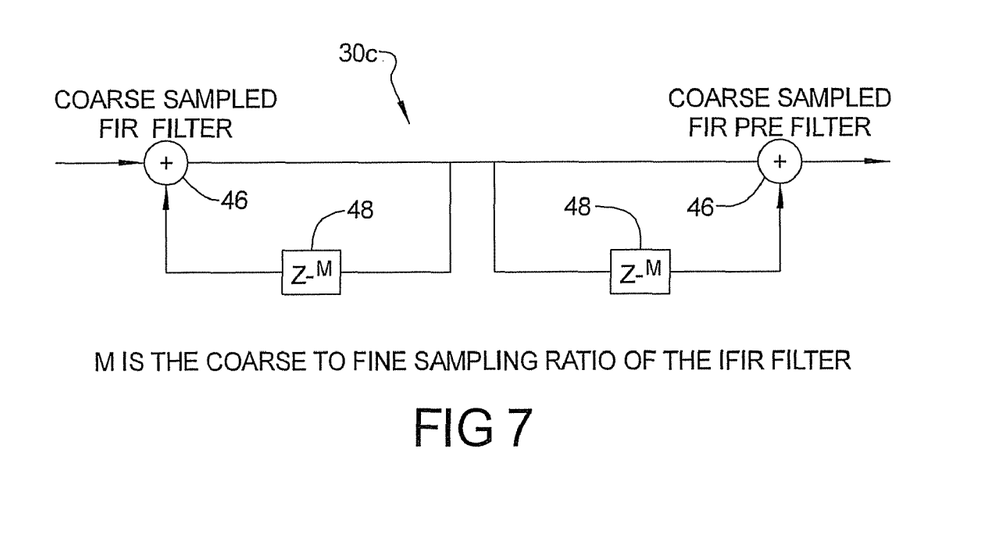
FIG. 7 is a block diagram of still another embodiment of the pre-filter of FIG. 4 in which a 1-2-1 cubic spline pre-filter is formed.
Figure 8:
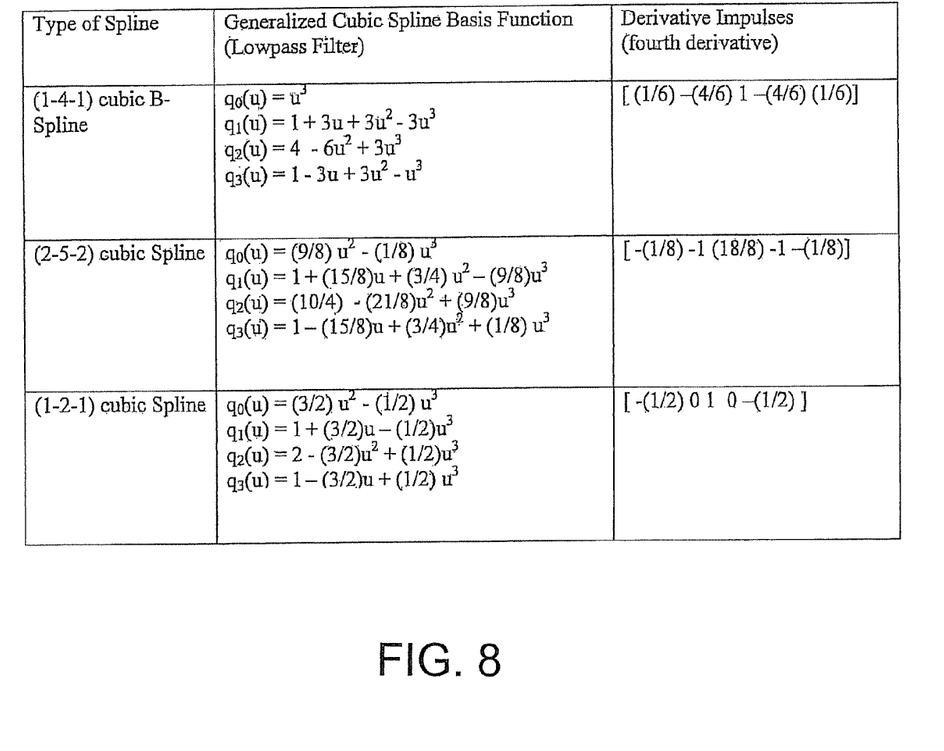
FIG. 8 is a chart illustrating characteristics of the pre-filters shown in FIGS. 5, 6 and 7.

FIG. 7 illustrate an implementation of a pre-filter (inverse) 30c for implementing the 1-2-1 spline. Note that only two adders 46 and only two delay elements 48 are required. No gain factors are required. The properties of the 1-4-1, 2-5-2 and 1-2-1 cubic B-splines are also summarized in the table of FIG. 8.

Figure 9:
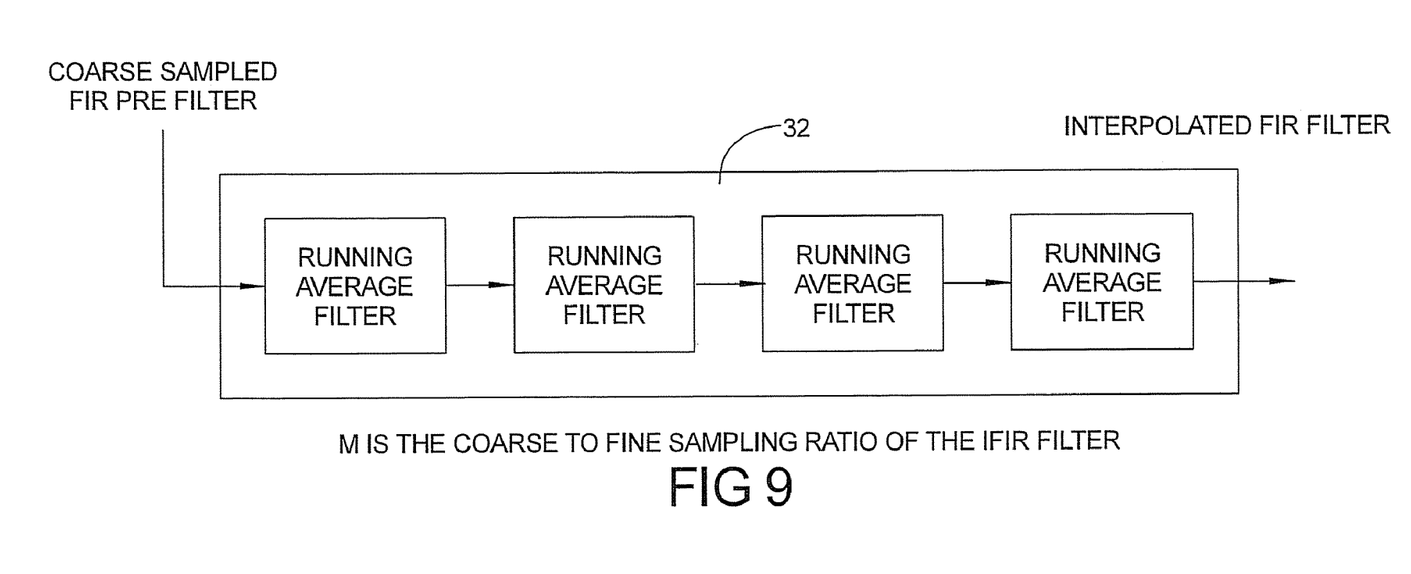
FIG. 9 a block diagram of an interpolating post-filter illustrated in FIG. 4.

Referring to FIG. 9, one embodiment of the interpolation post-filter 32 is shown. In this example, a cascade of four running average filters 50 is used for each of the three cubic B-spline IFIR filter implementations described above in FIGS. 5-7. The running average filter is basically a low pass filter and hence is useful for interpolation. A cubic spline interpolator is obtained with the use of four cascaded running average filters 50.

Figure 10:
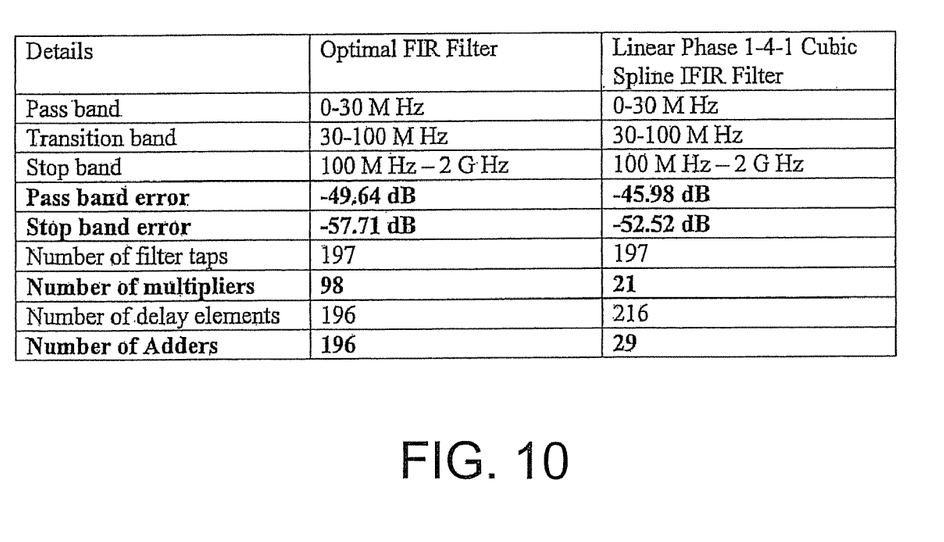
FIG. 10 is a chart illustrating the reduction in the number of multipliers and adders for a waveform processing subsystem incorporating the cubic spline IFIR filter of the present disclosure.
Figure 11A:
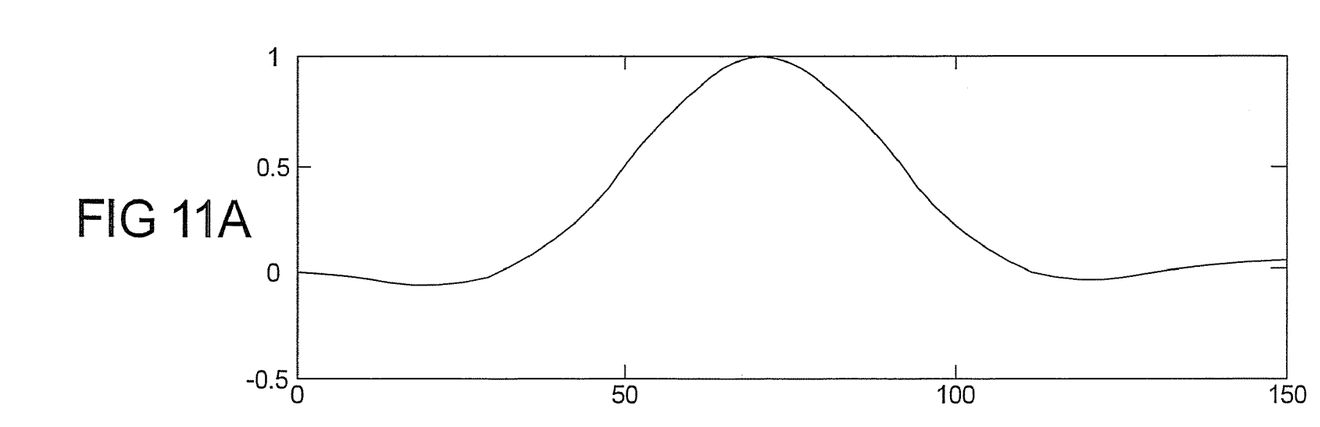
FIG. 11A is a sample input waveform prior to be filtered by the cubic spline IFIR filter of the present disclosure.
Figure 11B:
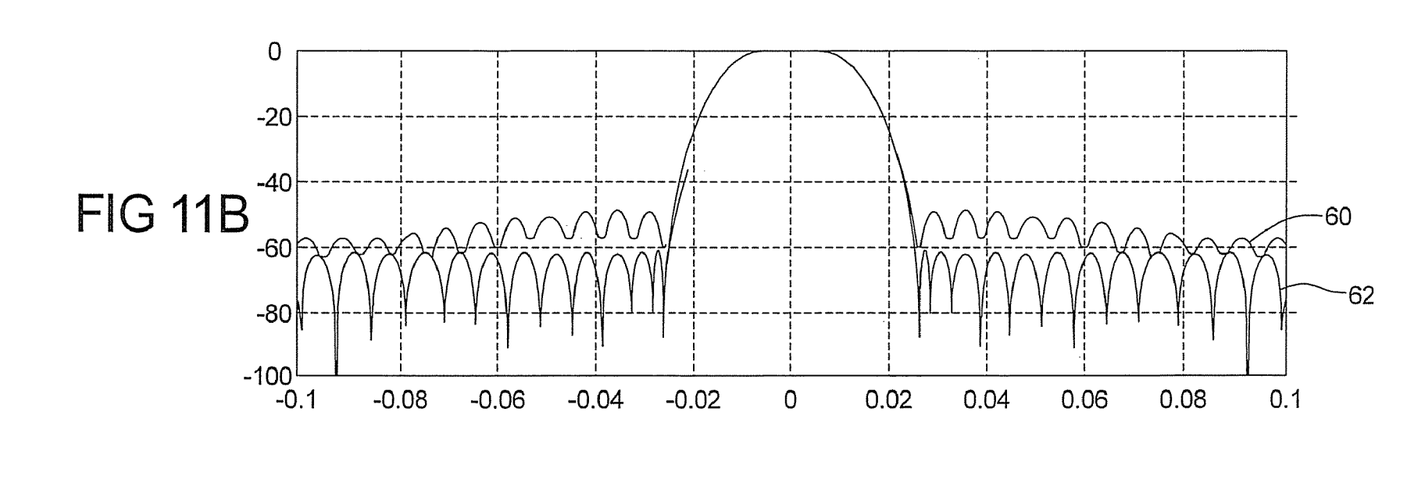
FIG. 11B shows the filtered output from an optimal, conventional FIR filter, and from a cubic spline IFIR filter in accordance with the present disclosure.

Thus, the pre-filters 30a, 30b and 30c for implementing the various cubic splines, as shown in FIGS. 5-7 respectively, are all easily implemented from a hardware design/construction standpoint, making them ideally suited to implementation via VLSI technology. When implementing the linear phase-B cubic spline IFIR filter 28 with a 1-4-1 spline in a wide band low pass filter, a very significant reduction in the number of multipliers and adders is realized, as indicated in the exemplary comparison table of FIG. 10. Similar component reductions can be realized for the 2-5-2 spline and 1-2-1 spline implementations. A comparison between the conventional optimal FIR filter and the cubic B-spline IFIR filter 28 incorporating the 1-4-1 cubic spline as described herein (in connection with FIG. 5) is illustrated in FIG. 11b, with an exemplary input waveform to the cubic B-spline IFIR filter 28 being shown in FIG. 11a. In FIG. 11b, the response of the 1-4-1 cubic spline is denoted by reference number 60, while the response from a conventional FIR filter is denoted by reference number 62. It will be noted that the response of the cubic B-spline IFIR filter 28 incorporating the 1-4-1 cubic spline pre-filter 30a closely approximates the response achieved via the conventional, optimal FIR filter (shown in FIG. 3). However, as noted above, the cubic B-spline IFIR filter 28 achieves this with a filter design having significantly fewer hardware adders and multipliers.

IFIR Design Process

Figure 12:
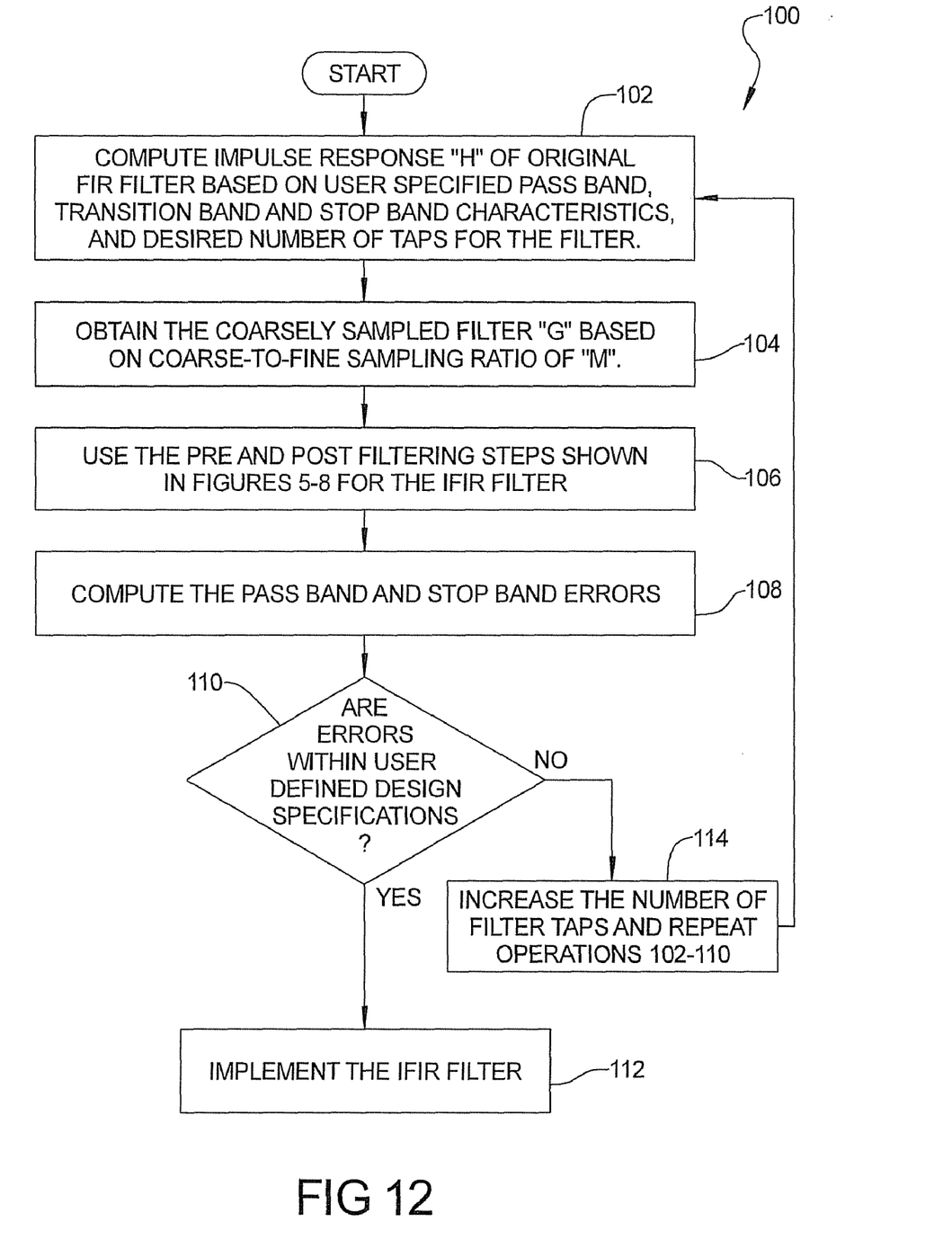
FIG. 12 is a flowchart setting forth a plurality of exemplary operations in designing a suitable cubic spline IFIR filter in accordance with the present disclosure.

The IFIR design process is summarized in the flowchart 100 of FIG. 12. At operation 102, the impulse response "h" of the original FIR filter is computed using the standard McClellan, Parks algorithm (see J. H. McClellan and T. W. Parks, "A Unified Approach To The Design Of Optimum FIR Linear Phase Digital Filters," IEEE Transactions on Circuit Theory, Vol. CT-20, November 1973, hereby incorporated by reference into the present application). The calculation is based on the user specified pass band, transition band and stop band characteristics as well as the desired number of taps for the filter.

At operation 104, obtain the coarsely sampled filter "g" based on the coarse-to-fine sampling ratio of "M". At operation 106 perform the pre-filtering operations described in connection with any one of the pre-filters of FIGS. 5, 6 and 7, along with the post-filtering operation described in connection with FIG. 9. At operation 108, compute the pass band and stop band errors. At operation 110, check whether the pass band and stop band errors are within predefined design specifications to determine if satisfactory filter performance has been achieved. If the answer is "Yes", proceed to implement the cubic B-spline IFIR filter in a suitable component, for example in a field programmable gate array (FPGA), as indicated at operation 112. If the errors are not within the predetermined specification, increase the number of filter taps and repeat operations 102-110 as indicated at operation 114 until a satisfactory filter design is achieved (i.e., one with stop band and pass band errors within acceptable limits).

Band Pass Filtering

From the foregoing discussion, it will be appreciated that once the configuration of a low pass IFIR filter having the desired filter characteristics is determined, then a band pass filter may be readily constructed. A band pass filter may be implemented by modulating the cubic B-spline IFIR filter 28 impulse response with the appropriate sign changes (i.e., plus or minus) reflecting the frequency of the carrier wave of the input waveform being fed into the cubic B-spline IFIR filter 28. However, in an application involving a software defined radio (SDR), since it will eventually be desired to demodulate the received RF signal (i.e. waveform) by bringing it to the base band, a more desirable approach will be to first decimate the received band pass signal. Then one can apply an appropriate IFIR filter to recover the base band signal. From FIG. 11b, the decimation process creates multiple copies of the spectrum of the original band pass signal due to the periodic nature of the sampling and the underlying Fast Fourier Transform (FFT) concepts that are used in the decimation process. The multiple copies of the spectrum of the original band pass signal include a copy at either the base band (if the carrier frequency happens to be an integral multiple of the sampling rate) or very near to it. This provides a highly advantageous side effect of down sampling that eliminates the need for special circuitry to down shift the signal by using complex demodulation schemes. Rather, the signal can be demodulated simply by applying an efficient low pass or band pass filter on or near the base band. Thus, the description relating to the cubic B-spline IFIR low pass filter 28 applies equally to band pass filtering as well.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. An interpolating cubic spline filter adapted for digital filtering applications, the filter comprising:
    a pre-filter section including a linear, phase-B cubic spline circuit; and
        a post-filter section including a cubic spline interpolator for providing an interpolated digital output signal from an output of said pre-filter section; and
    wherein said pre-filter section comprises a 1-4-1 cubic B-spline configuration including:
    a pair of adders;
    a pair of delay elements; and
    a pair of multipliers.

2. The filter of claim 1, wherein the filter comprises a pass band filter.

3. The filter of claim 1, wherein the filter comprises a stop band filter.

4. The filter of claim 1, wherein a first one of said multipliers has a gain of $2-\sqrt{3}$ and a second one of said multipliers has a gain of $2+\sqrt{3}$.

5. The filter of claim 1, wherein said post-filter section includes a plurality of serially connected, running average filters.

6. The filter of claim 5, wherein said post-filter section includes four serially connected, running average filters.

7. An interpolating cubic spline filter adapted for digital filtering applications, the filter comprising:
    a pre-filter section including a linear, phase-B cubic spline circuit; and
    a post-filter section including a cubic spline interpolator for providing an interpolated digital output signal from an output of said pre-filter section wherein said pre-filter section comprises a 2-5-2 cubic spline configuration including:
    a pair of adders;
    a pair of delay elements;
    a left shift element; and
    a right shift element.

8. An interpolating cubic spline filter adapted for digital filtering applications, the filter comprising:
    a pre-filter section including a linear, phase-B cubic spline circuit; and
    a post-filter section including a cubic spline interpolator for providing an interpolated digital output signal from an output of said pre-filter section; and
    wherein said pre-filter section comprises a 1-2-1 cubic B-spline configuration including:
    a pair of adders; and
    a pair of delay elements.

9. An interpolating cubic spline filter adapted for digital filtering applications, the filter comprising:
    a pre-filter section including a linear, phase-B cubic spline circuit, said linear, phase-B spline circuit including one of:
    a 1-4-1 cubic spline configuration;
    a 2-5-2 cubic spline configuration; and
    a 1-2-1 cubic spline configuration;
    a post-filter section including a cubic spline interpolator for providing an interpolated digital output signal from an output of said pre-filter section.

10. The filter of claim 9, wherein said pre-filter section includes said 1-4-1 cubic spline function, said 1-4-1 cubic spline function being implemented by a circuit including:
    a pair of adders;
    a pair of delay elements; and
    a pair of multipliers.

11. The filter of claim 10, wherein said multipliers comprise a first multiplier and a second multiplier, said first multiplier having a gain of $2-\sqrt{3}$ and said second multiplier having a gain of $2+\sqrt{3}$.

12. The filter of claim 9, wherein said pre-filter section includes said 2-5-2 cubic spline function, said 2-5-2 cubic spline function being implemented by a circuit including:
    a pair of adders;
    a pair of delay elements;
    a left shift element; and
    a right shift element.

13. The filter of claim 9, wherein said pre-filter section comprises a 1-2-1 cubic spline function, said 1-2-1 cubic spline function being implemented by a circuit including:
    a pair of adders; and
    a pair of delay elements.

14. The filter of claim 9, wherein said post-filter includes a plurality of running average filters.

15. The filter of claim 14, wherein said cascade, running average filters are connected serially.

16. A method for filtering a digital signal being one of transmitted from an electronic device or received by said electronic device, comprising:
    an operation including forming a pre-filter circuit using a linear, phase-B, cubic spline pre-filter;
    using cubic spline interpolating post-filter circuit to interpolate an output of the pre-filter, to thus provide an interpolated digital output signal; and
    wherein said operation of forming a pre-filter circuit comprises using one of:
    a 1-4-1 cubic B-spline configuration;
    a 2-5-2 cubic spline configuration; and
    a 1-2-1 cubic spline configuration.

17. The method of claim 16, wherein using an interpolating post-filter comprises using a plurality of running average filters to provide said interpolated output signal.

18. The method of claim 17, wherein using a plurality of running average filters comprises using a plurality of running average filters connected serially.

* * * * *